United States Patent [19]

Houston

[11] Patent Number: 5,544,101

[45] Date of Patent: Aug. 6, 1996

[54] MEMORY DEVICE HAVING A LATCHING MULTIPLEXER AND A MULTIPLEXER BLOCK THEREFOR

[75] Inventor: Theodore W. Houston, Richardson, Tex.

[73] Assignee: Texas Instruments Inc., Dallas, Tex.

[21] Appl. No.: 219,609

[22] Filed: Mar. 28, 1994

[51] Int. Cl.$^6$ ................................. G11C 7/00; H03J 3/04
[52] U.S. Cl. ................. 365/189.02; 365/189.05; 365/230.02; 365/230.08; 327/407
[58] Field of Search .................. 365/189.02, 189.05, 365/230.02, 230.08; 327/407, 408

[56] References Cited

U.S. PATENT DOCUMENTS

| | | | |
|---|---|---|---|
| 4,593,390 | 6/1986 | Hildebrand et al. | 327/407 |
| 4,932,002 | 6/1990 | Houston | 365/241 |
| 5,214,610 | 5/1993 | Houston | 365/233.5 |
| 5,311,519 | 5/1994 | Getzlaff et al. | 365/189.02 |
| 5,341,488 | 8/1994 | Kobayashi | 365/189.02 |
| 5,357,146 | 10/1994 | Heimann | 327/407 |

FOREIGN PATENT DOCUMENTS

| | | |
|---|---|---|
| 0199134 | 10/1986 | European Pat. Off. . |
| 0490363 | 6/1992 | European Pat. Off. . |
| 0552667A1 | 7/1993 | European Pat. Off. ........ G06F 12/08 |

OTHER PUBLICATIONS

*IEEE Journal of Solid–State Circuits*, Bernard K. Gunther, "An Integrated Pre-Access Architecture for CMOS SRAM", vol. 27, No. 6, pp. 901–907, Jun. 1992.

*Primary Examiner*—David C. Nelms
*Assistant Examiner*—Son Dinh
*Attorney, Agent, or Firm*—William B. Kempler; Richard L. Donaldson

[57] ABSTRACT

A memory device (10) is provided which includes a memory array (12), a multiplexer block (14) and a control block (16). The memory array (12) is operable to provide a plurality of memory array outputs ($28_1 \ldots 28_n$) responsive to a memory address (MEMORY ADDRESS). Each memory array output ($28_1 \ldots 28_n$) represents a data state of a memory cell. The multiplexer block (14) comprises at least one latch block ($30_1 \ldots 30_i, 32_1 \ldots 32_j, 34_1, 34_2$, and 36) arranged in at least one stage. The multiplexer block is coupled to the plurality of memory array outputs ($28_1 \ldots 28_n$). The multiplexer block (14) is operable to provide a multiplexer block output (38) representing a data state of a desired memory cell corresponding to the memory address (MEMORY ADDRESS) responsive to a plurality of multiplexer control signals ($44_1 \ldots 44_m$). Each latch block is operable to receive a plurality of input signals, operable to retain a plurality of data states and operable to provide an output signal. A control block (16) is coupled to the memory array (12) and to the multiplexer block (14). The control block (16) is operable to determine from the memory address (MEMORY ADDRESS) whether the data state of the desired memory cell is retained by a latch block in the multiplexer block (14) and operable to generate the plurality of multiplexer control signals ($44_1 \ldots 44_m$).

28 Claims, 3 Drawing Sheets

MEMORY DEVICE HAVING A LATCHING MULTIPLEXER AND A MULTIPLEXER BLOCK THEREFOR

TECHNICAL FIELD OF THE INVENTION

This invention relates in general to the field of electronic systems, and more particularly to an improved memory device and method of construction.

BACKGROUND OF THE INVENTION

Memory devices including SRAM's, DRAM's and ROM's are widely used in electronic circuits to store data in the form of logic bits which can be accessed by using a memory address. Generally, a memory address is provided to a memory device, and the memory device executes a memory cycle to provide data from or store data to the location in the memory device associated with the memory address.

Memory devices are implemented according to various architectures. Memory devices may include a memory array containing a large number of memory cells where each memory cell can be set to one of two data states storing one bit of information. The memory cells often are arranged in rows and columns, thus each memory cell can be referenced by a unique memory address which includes a row address and a column address. Generally, a row address selects a word line that enables access of each memory cell in that row to associated column or bit lines, where the bit lines may be in pairs to transmit differential signals. Large memories may be divided into blocks such that the row address selects a global word line that is selectively connected to block word lines in response to the block address. The block address may be included in the general term of column address, since it is part of the address that selects a particular column.

Memory devices commonly operate in a read mode and a write mode, thus memory devices execute memory read cycles and memory write cycles. In many memory devices, the data states of every memory cell in the row specified by the row address are accessed during a memory read cycle. These data states are then multiplexed according to the column address to provide an output which represents the data states of the memory cells corresponding to the memory address. The number of memory cells for which the data state is output in one access depends on the organization of the given memory. Typical organizations are x1, x4, or x8. The output from a memory array prior to multiplexing represents all or a subset of the memory cells corresponding to the row address. A memory write cycle usually operates in a manner similar to a memory read cycle with the data state of the memory cell corresponding to the memory address being set according to a data value provided to the memory device. Memory devices can be designed such that read and write cycles can read from or store to one or more memory cells.

In some memory devices, address transition detection is used to detect changes in the memory address and to initiate a full memory cycle only when the memory address changes sufficiently. A low power access mode can be implemented by distinguishing row address changes from column address changes and initiating a memory array access only when the row address changes. One implementation of such a low power access mode is to latch the outputs of the memory array representing the data states of memory cells corresponding to the row address. A change in the memory address that only includes a change in the column address then can be handled by accessing the latched data states rather than accessing the memory array. This low power access mode saves power by preventing the memory device from precharging the memory array and decoding the full memory address for memory read cycles during which the row address does not change.

While latching the data at each column allows this low power access mode, it may be difficult to layout a latch to fit in the pitch of a column. Also, in large memories, the multiplexing of data from the columns to the output may be done in several stages. The driving and sensing of data through the plurality of stages in the multiplexer further consumes power even in such a low power access mode. This particularly may be true if differential signals are used in multiplexing to reduce access time.

The sensing of the outputs of the memory array consumes power and can cause a power consumption problem in memory devices with large memory arrays. Sensing the outputs of the memory array prior to multiplexing the outputs can require the driving of column lines and activating sense amplifiers equal to the width of the memory array. For example, a 64-bit RAM having 256 rows and 256 columns would require 256 sense amplifiers to sense the data states of every memory cell in one row. Even in a memory access cycle in which the row address does not change, the 256 columns must be driven and 256 sense amplifiers activated consuming power. Further, if the outputs of the memory array are implemented as differential signals and are multiplexed, sense amplifiers must be paired with each input to the multiplexer and also consume power. Driving these devices causes power consumption even during a low power access mode when the row address does not change. This power consumption is a problem because it is desirable for a memory device to consume as little power as possible.

SUMMARY OF THE INVENTION

Therefore, a need has arisen for an improved memory device that provides low power consumption.

In accordance with the present invention, a memory device is provided that substantially eliminates or reduces disadvantages and problems associated with prior memory devices.

According to one embodiment of the present invention, a memory device is provided that includes a memory array comprising a plurality of memory cells. The memory array is operable to provide a plurality of memory array outputs responsive to a memory address. Each memory array output represents a data state of a memory cell. The memory device also includes a multiplexer block comprising at least one latch block arranged in at least one stage. The multiplexer block is coupled to the plurality of memory array outputs. The multiplexer block is operable to provide a multiplexer block output representing a data state of a desired memory cell corresponding to the memory address responsive to a plurality of multiplexer control signals. Each latch block is operable to receive a plurality of input signals, operable to retain a plurality of data states and operable to provide an output signal. A control block is coupled to the memory array and to the multiplexer block. The control block is operable to determine from the memory address whether the data state of the desired memory cell is retained by a latch block in the multiplexer block and is operable to generate the plurality of multiplexer control signals.

According to another embodiment of the present invention, a method for constructing a memory device is provided which comprises a number of steps. A first step includes providing a memory array comprising a plurality of memory cells and comprising a plurality of memory array outputs. A next step includes providing a multiplexer block comprising at least one latch block arranged in at least one stage and comprising a multiplexer block output, each latch block operable to receive a plurality of input signals, operable to retain a plurality of data states and operable to provide an output signal. A next step includes connecting the multiplexer block to the plurality of memory array outputs. A last step includes connecting a control block to the memory array and the multiplexer block. The control block is operable to decode a memory address to determine a desired memory cell to which the memory address corresponds, is operable to determine from the memory address whether a data state of the desired memory cell is stored by a latch block in the multiplexer block, and is operable to control the multiplexer block to set a data state of the multiplexer block output corresponding to the data state of the desired memory cell.

BRIEF DESCRIPTION OF THE DRAWINGS

A more complete understanding of the present invention and advantages thereof, may be acquired by referring to the following description taken in conjunction with the accompanying drawings in which like reference numbers indicate like features and wherein:

FIG. 2b illustrates a timing diagram showing one embodiment of the operation of the control signals for the latch cell illustrated in FIG. 2a;

DETAILED DESCRIPTION OF THE INVENTION

Figure 1:
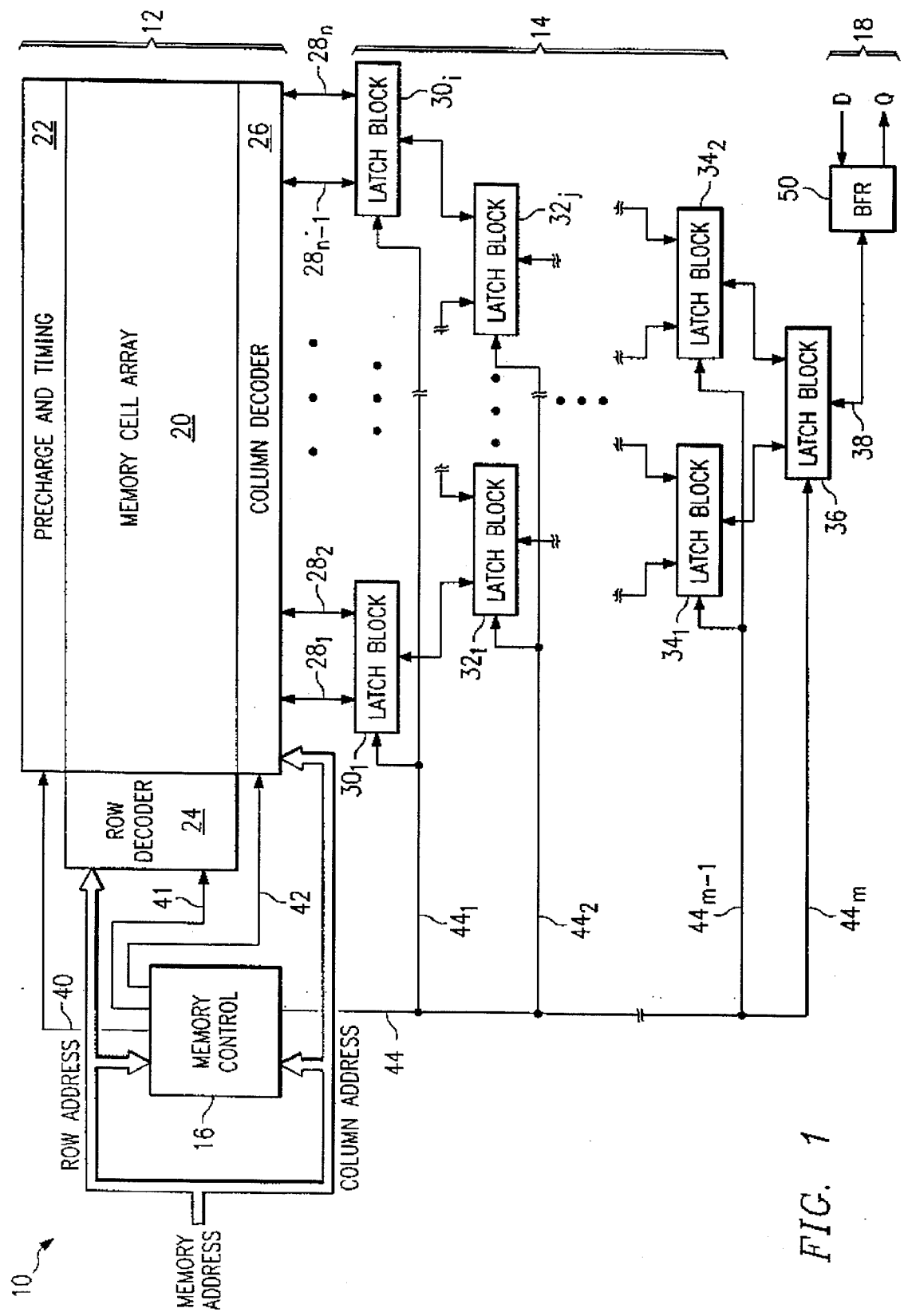
FIG. 1 illustrates a block diagram of a memory device constructed according to the teachings of the present invention.

FIG. 1 illustrates a block diagram of a memory device indicated generally at 10 constructed according to the teachings of the present invention. Memory device 10 comprises a memory array indicated generally at 12, a multiplexer block indicated generally at 14, a memory control block 16, and an output block indicated generally at 18. A MEMORY ADDRESS comprising a ROW ADDRESS and a COLUMN ADDRESS is provided to memory control block 16 and to memory array 12 as shown.

Memory array 12 comprises a memory cell array 20. Memory cell array 20 includes a plurality of memory cells arranged in rows and columns. Memory cell array 20 can include any suitable number of memory cells arranged in any suitable manner. One embodiment of a memory array 12 comprises a 64K-bit memory cell array with 256 rows and 256 columns of memory cells. A precharge and timing circuit 22 is coupled to memory cell array 20 as shown. A row decoder 24 and a column decoder 26 are coupled to the memory cell array 20 as shown. Memory array 12 comprises a number of memory array outputs $28_1$, $28_2$, ... $28_{n-1}$, and $28_n$. These n memory array outputs represent the data states of n memory cells in memory cell array 20.

Figure 2A:
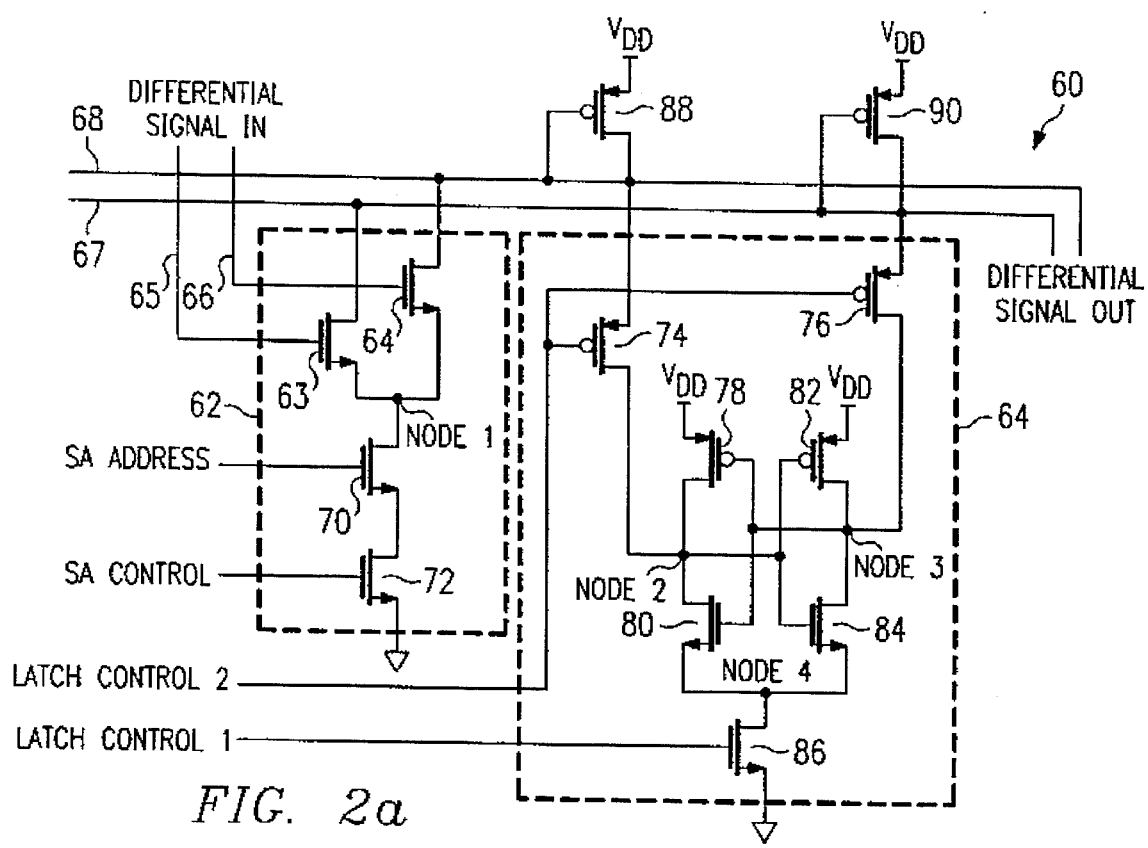
FIG. 2a illustrates one embodiment of a latch cell constructed according to the teachings of the present invention.
Figure 2B:
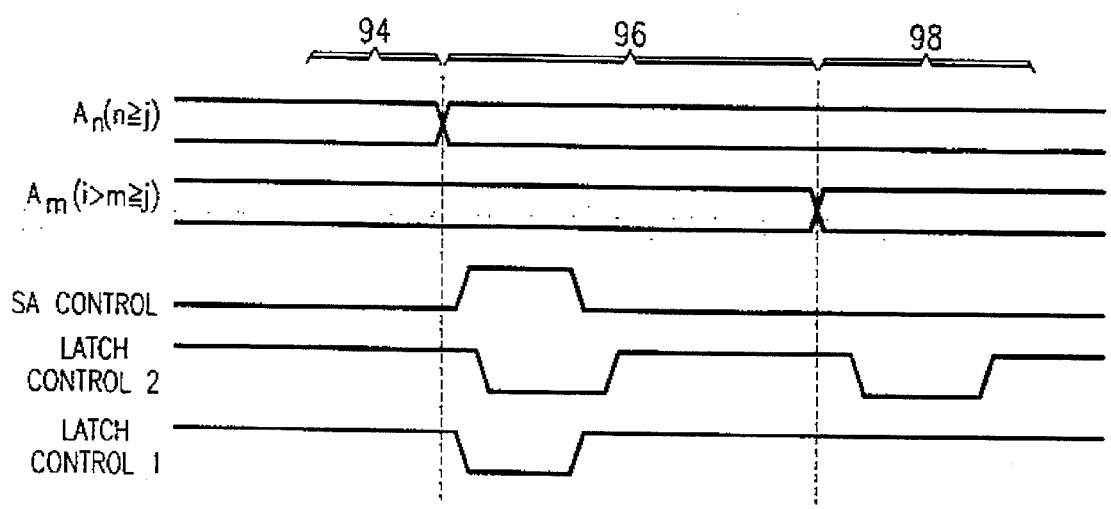
Figure 2C:
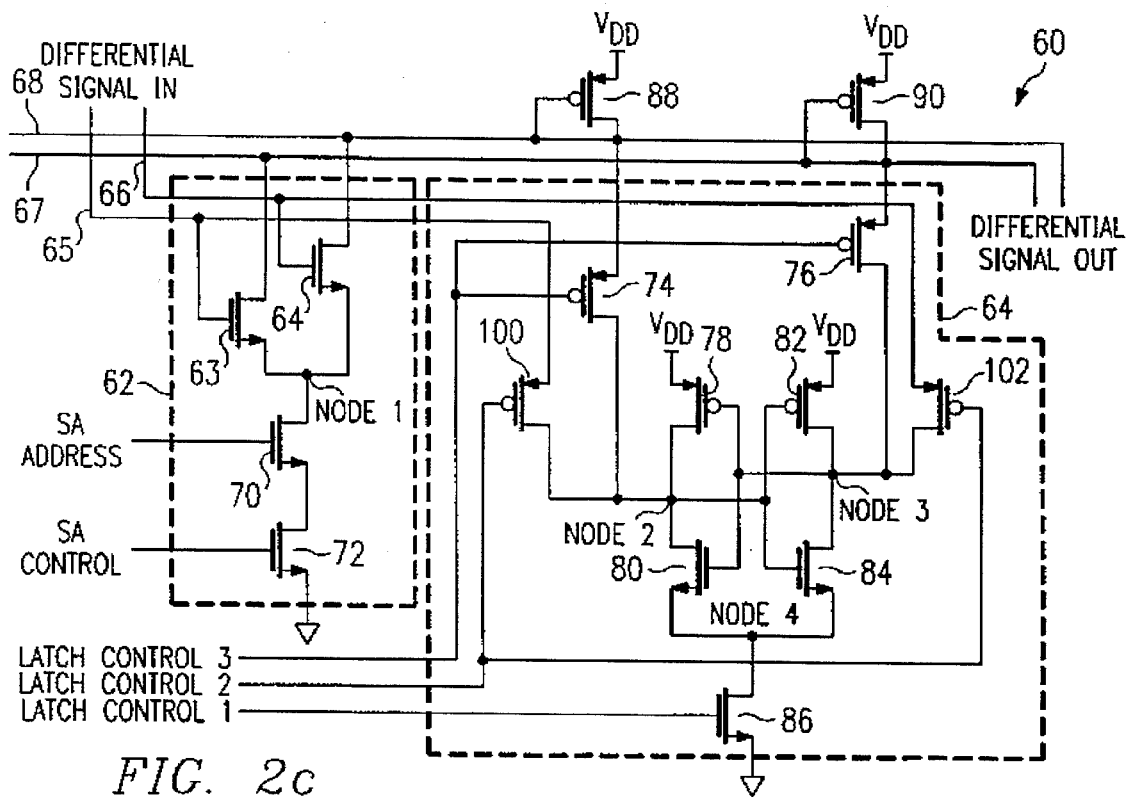
FIG. 2c illustrates another embodiment of a latch cell constructed according to the teachings of the present invention.

Multiplexer block 14 comprises a number of latch blocks arranged in a number of stages as shown. In one embodiment, each latch block comprises a latch corresponding to the output of that latch block. One possibility for this embodiment of the invention comprises a plurality of sense amplifiers and a latch as illustrated in FIG. 2a. In another embodiment of this invention, each latch block in the multiplexer block 14 comprises a plurality of latch cells equal in number to the number of inputs to the latch block. In one embodiment of the present invention, each latch cell comprises a latch and a sense amplifier as illustrated in FIG. 2c.

Latch block $30_1$ through latch block $30_i$ comprise a first stage of multiplexer block 14. Latch block $30_1$ is coupled to memory array outputs $28_1$ and $28_2$. Latch block $30_i$ is coupled to the last two memory array outputs $28_{n-1}$ and $28_n$. As shown, the first stage of latch blocks comprises a number of latch blocks equal to i. The number of latch blocks in the first stage can be any suitable number coupled to receive all of the memory array outputs $28_1$ through $28_n$.

A second stage of latch blocks comprises latch block $32_1$ through latch block $32_j$. The number of latch blocks j in the second stage depends upon the number of inputs to each of the j latch blocks in the second stage. In the embodiment shown in FIG. 1, each latch block receives two outputs from the prior stage. Therefore, the number of latch blocks j in the second stage is equal to one-half the number of latch blocks i in the first stage. Multiplexer block 14 can comprise any suitable number of stages of latch blocks.

Multiplexer block 14 comprises two final stages. A penultimate stage comprises latch block $34_1$ and latch block $34_2$, and a final stage comprises latch block 36 coupled as shown. The output of latch block 36 in the last stage of multiplexer block 14 comprises multiplexer block output 38.

In the embodiment of FIG. 1, all of the latch blocks in multiplexer block 14 receive two inputs and provide one output and multiplexer block 14 comprises m stages. In alternative embodiments of the present invention, the latch blocks each receive three or more of the memory array outputs $28_1$ through $28_n$ of the memory array 12. There is no restriction that each of the latch blocks have the same number of inputs. Also, latching and non-latching multiplexer elements may be intermixed. Further, the sequential numbering of the inputs does not imply that the inputs come from any particular ordering of the outputs from the previous stage or columns of the memory array 12.

Memory control block 16 provides memory control signals 40, 41, and 42 and provides multiplexer control signals 44. Memory control signal 40 is coupled to the precharge and timing circuit 22. Memory control signal 41 is coupled to the row decoder 24, and memory control signal 42 is coupled to column decoder 26. Multiplexer control signals 44 comprise multiplexer control signals for each stage of multiplexer block 14. As shown in FIG. 1, multiplexer control signals 44 comprise multiplexer control signals $44_1$ through multiplexer control signals $44_m$. Multiplexer control signals $44_1$ are coupled to latch blocks $30_1$ through latch blocks $30_i$ in the first stage, and multiplexer control signals $44_2$ are coupled to latch blocks $32_1$ through $32_j$ in the second stage as shown. Multiplexer control signals $44_{m-1}$ are coupled to latch blocks $34_1$ and $34_2$, and multiplexer control signals $44_m$ are coupled to latch block 36 as shown.

In one embodiment of the present invention, memory array outputs $28_1$ through $28_n$ are differential signals, and the outputs of each latch block in multiplexer block 14 are differential signals. Differential signals may be used for all or a subset of the latch block outputs.

Output block 18 comprises an input/output buffer 50. Input/output buffer 50 is coupled to multiplexer block output 38 and to an input data bit D. The input/output buffer 50 provides an output data bit Q. Alternatively, separate input and output paths may be used. Some memories are organized so that a common input/output (I/O) pin is used for input and output of data. For these memories, the buffer is referred to as an input/output (I/O) buffer. For other memory organizations, separate pins are used for input and output of data. For either case, common busses may or may not be used for the multiplexing and transfer of data from the memory array to the buffer and from the buffer to the memory array. In either case, separate circuitry generally is used for driving the busses for input data and for output data. The teachings of the present invention relate to the multiplexing of the output data, and are applicable whether or not common I/O busses and/or common I/O buffers are used.

Memory device 10 operates to provide a data state of a memory cell corresponding to the MEMORY ADDRESS as data output Q and operates to store data input D by setting a data state of a memory cell corresponding to the MEMORY ADDRESS.

Memory array 12 operates to provide data states of memory cells in a row of memory cell array 20 corresponding to the ROW ADDRESS. The ROW ADDRESS and the COLUMN ADDRESS are provided to row decoder 24 and to column decoder 26, as shown. Memory array 12 provides the data states of the memory cells in memory cell array 20 corresponding to the ROW ADDRESS and the COLUMN ADDRESS responsive to the row decoder 24 and the column decoder 26. Memory array 12 is operable to provide all or a subset of the data states of the memory cells in the indicated row of memory cell array 20 as memory array outputs $28_1$ through $28_n$. In the illustrated embodiment of the present invention, memory array 12 provides n memory array outputs $28_1$ through $28_n$.

Memory control block 16 operates to generate memory control signals 40, 41, and 42. Memory control block 16 controls precharge and timing circuit 22 with memory control signal 40. Memory control block 16 controls row decoder 24 and column decoder 26 with memory control signal 41 and memory control signal 42, respectively.

Memory control block 16 operates to generate multiplexer control signals 44 comprising multiplexer control signals $44_1$ through $44_m$. Memory control block 16 controls operation of each stage in multiplexer block 14 with multiplexer control signals $44_1$ through $44_m$.

Multiplexer block 14 operates to multiplex memory array outputs $28_1$ through $28_n$ to provide multiplexer block output 38. Multiplexer block output 38 represents the data state of the memory cell corresponding to the MEMORY ADDRESS provided to memory device 10. As discussed above, multiplexer block 14 can comprise a number of latch blocks arranged in a number of stages. The latch blocks are arranged such that memory array outputs $28_1$ through $28_n$ are multiplexed to set multiplexer block output 38. One of memory array outputs $28_1$ through $28_n$ represents the data state of the memory cell corresponding to the MEMORY ADDRESS. Multiplexer block 14 operates to select the appropriate data state and provide that data state as multiplexer block output 38.

Multiplexer block 14 operates to multiplex data states from the number of memory array outputs provided by memory array 12 to set multiplexer block output 38 provided to output block 18. The number of output data bits can be any suitable number and is shown as one bit for illustrative purposes only. One alternative is a multiple bit output with parallel output paths.

Each latch block comprises at least one input and an output. The number of inputs relates to the degree of multiplexing to be accomplished at a given stage. If there is only one input, the latch block acts as a relay. In FIG. 1, each latch block comprises two inputs because multiplexing by a factor of two is to be accomplished at each stage. In one embodiment of the present invention, the latch block is operable to latch its output. One embodiment is illustrated in FIG. 2a where each latch block comprises one latch and at least one input, with a sense amplifier associated with each input. In another embodiment, the latch block is operable to latch each input. One possibility for this embodiment is illustrated in FIG. 2c where the latch block comprises a sense amplifier and a latch associated with each input. In each of these embodiments, the latch block is operable to multiplex the inputs and provide an output. The latch block is further operable to provide an output from latched data.

The operation of multiplexer block 14 is controlled by multiplexer control signals 44 provided by memory control block 16. Multiplexer control signals $44_1$ through $44_m$ control the operation of the latch cells in the latch blocks in multiplexer block 14. One embodiment for controlling the latch blocks is for the multiplexer control signals 44 to operate to control the latch blocks such that each latch cell latches a data state only if the input to the latch cell corresponds to the COLUMN ADDRESS. In an alternative embodiment, the multiplexer control signals 44 operate to control the latch blocks such that each latch cell always latches the data state of the input to the latch cell. Multiplexer control signals $44_1$ through $44_m$ control the output of each latch block in multiplexer stage 14 and the latching of data states by the latch cells.

Output block 18 operates to provide data output from memory device 10 and to receive data input to memory device 10. Input/output buffer 50 operates to sense the data state of multiplexer block output 38 and provide an output data bit Q representing the date state of multiplexer block output 38. Input/output buffer 50 also operates to sense the data state of an input data bit D and provide that data state to latch block 36 on multiplexer block output 38. As stated above, separate input and output paths may be used.

In one embodiment of the present invention, multiplexer block 14 also is operable to connect input/output buffer 50 to memory array 12 allowing a data input bit to be stored as a data state of a memory cell in memory cell array 20. When operating to store data rather than provide data, memory control block 16 controls the latch blocks in the multiplexer block 14 such that an appropriate one of memory array outputs $28_1$ through $28_n$ is set to the data state of input data bit D. In this embodiment, the input data may also be latched at the intermediate multiplex latches and and become available for subsequent output from these latches.

A technical advantage of the present invention is latching of data states in multiplexer block 14. Space can be limited when a memory device is constructed in an integrated circuit on a semiconductor chip. The number of latch blocks and number of stages in multiplexer block 14 can be designed as suitable for the space available. Some conventional memory devices have a sense amplifier and a latch at each column. This may be difficult to fit in the pitch of the memory array. According to the teachings of the present invention, any number of columns may be multiplexed into the first latch block. This initial multiplexing before the first latch block may be done in a single or multiple stages of multiplexing.

In a memory access, more memory cells commonly are accessed internally than data bits are provided as outputs. According to this technical advantage of the present invention, at least some subset of the data states of the extra memory cells are latched and subsequently accessed faster with lower power than from the memory array. Power consumption is reduced by not activating devices upstream of the latch holding the addressed data state when the upstream address does not change. The further upstream latches are implemented, the wider the address range of the latched data. The further downstream, the greater the power saving when the latched data is accessed. Latches can be implemented at each stage of multiplexing allowing devices to be activated at different stages as necessary.

Latches may be implemented at desired levels of multiplexing. Latches alternatively may be implemented only at the first stage of multiplexing, only at the last stage of multiplexing, only at an intermediate stage of multiplexing, or at any selected subset of the stages of multiplexing. For memory device applications in which there are likely to be sets of memory accesses in which the address is changed sequentially, such as in a system with a cache memory or in retrieving sequences of instructions, the likelihood of accessing data that is in a latch will be high if the address sequencing and the multiplexing are arranged so that the information stored in the latches are for sequential addresses. This is true even with only a few latches such as latches only in the last stage of multiplexing.

Consequently, one embodiment of the present invention is to have the addresses of the latches defined by the least significant, or most frequently changed, bits in the memory address. For example, a 64K memory could be arranged in 256 rows and 256 columns, with address bits a0–a7 specifying the column and address bits a8–a15 specifying the row. Further, the columns can be multiplexed in three stages, going from 256 bits to 32 bits to 4 bits to the final one bit output. If latches are placed at the 4 bit stage of the multiplexer and the address bits a0 and a1 specify the location among those four bits, then there will be the greatest saving in power if address bits a0 and a1 are the most frequently changed. If latches are included only at the 32 bit stage of the multiplexing, and address bits a0 through a4 specify these locations, then there will be power savings when the address changes only in bits a0 through a4 in successive cycles. In this second case, the power savings will not be as great for one such cycle as it would be if the latch were at the last stage of multiplexing, as in the first case, but the low power mode spans a greater address space. Latches could be placed at both stages of the multiplexer to gain the benefits of both cases, a low power mode for a wider address space, and the lowest power for a segment of that address space, at some cost in circuitry complexity and area.

Where a memory has I/O pins following conventional arrangement, one embodiment of the present invention is to have the address space of the latches defined by the least significant address bits. Where the memory is used in a system, one embodiment of the present invention has the address space of the latches defined by the most frequently changed address bits, with the highest frequency of change corresponding to the latches furthest down stream in the multiplexer block.

The present invention teaches a memory device architecture having latches at the multiplexer block 14 reducing power consumption. Power consumption is reduced whether or not differential signals are implemented although the power savings is greater when differential signals are used in the multiplexer block 14. The memory device architecture of the present invention is beneficial for all memories, but is especially beneficial for memories implemented using large cell arrays.

A technical advantage of the present invention is the use of latches with differential signals in the multiplexer block 14. Use of differential signals can reduce the delay in propagating a signal through the multiplexer block, particularly for large memories, by eliminating the need for full signal swings on the busses. The reduced signal swing can also reduce power, but the holding and sensing of differential signals generally consumes significant power. Thus, the use of latches to reduce the number of occurrences requiring the driving and sensing of differential signals saves significant power.

A further technical advantage of the present invention is latching the differential signals without driving the differential signals from rail to rail. The use of latches can conflict with the use of differential signals because latches often are full signal. The latch cells in multiplexer block 14 are constructed such that the differential signals are not driven from rail to rail. One embodiment of a latch cell is illustrated in FIGS. 2a and 2b. The latches in the latch cells are driven from rail to rail, but the differential signals are only driven with a differential swing.

FIG. 2a illustrates one embodiment of a latch cell indicated generally at 60 constructed according to the teachings of the present invention. Latch cell 60 comprises a sense amplifier 62 and a latch 73.

Sense amplifier 62 comprises an n-channel field effect transistor (N-FET) 63 and an N-FET 64. A gate of N-FET 63 is coupled to a line 65, and a gate of N-FET 64 is coupled to a line 66. A drain of N-FET 63 is coupled to a line 67 and a drain of N-FET 64 is coupled to a line 68. A source of N-FET 63 and a source of N-FET 64 are coupled to a NODE 1. Sense amplifier 62 further comprises an N-FET 70 and an N-FET 72. N-FET 70 comprises a source, a drain coupled to NODE 1, and a gate coupled to a sense amplifier address signal SA ADDRESS. N-FET 72 comprises a drain coupled to the source of N-FET 70, a gate coupled to a sense amplifier control signal SA CONTROL and a source coupled to ground potential.

Latch 73 comprises a p-channel field effect transistor (P-FET) 74 and a P-FET 76. P-FET 74 comprises a source coupled to line 68, a gate coupled to a second latch control signal LATCH CONTROL 2 and a drain coupled to a NODE 2. P-FET 76 comprises a source coupled to line 67, a gate coupled to the second latch control signal LATCH CONTROL 2 and a drain coupled to a NODE 3. Latch 73 also comprises a P-FET 78, an N-FET 80, a P-FET 82 and an N-FET 84. P-FET 78 comprises a source coupled to a positive power supply $V_{DD}$, a gate coupled to a NODE 3, and a drain coupled to NODE 2. N-FET 80 comprises a drain coupled to NODE 2, a gate coupled to NODE 3, and a source coupled to a NODE 4. P-FET 82 comprises a source coupled to positive power supply $V_{DD}$, a gate coupled to NODE 2, and a drain coupled to NODE 3. N-FET 84 comprises a drain coupled to NODE 3, a gate coupled to NODE 2, and a source coupled to NODE 4. Latch 73 further comprises an N-FET 86. N-FET 86 comprises a drain coupled to NODE 4, a gate coupled to a first latch control signal LATCH CONTROL 1 and a source coupled to ground potential.

Latch cell 60 further comprises a P-FET 88 and a P-FET 90. P-FET 88 comprises a source coupled to power supply $V_{DD}$, a gate coupled to line 68, and a drain coupled to line 68. P-FET 90 comprises a source coupled power supply $V_{DD}$, a gate coupled to line 67, and a drain coupled to line 67.

A differential input signal DIFFERENTIAL SIGNAL IN is coupled to line 65 and line 66 and a differential output signal DIFFERENTIAL SIGNAL OUT is coupled to line 67 and line 68.

Latch cell 60 operates to drive the differential output signal DIFFERENTIAL SIGNAL OUT according to the data state of the differential input signal DIFFERENTIAL SIGNAL IN or to drive the differential output signal DIFFERENTIAL SIGNAL OUT according to a data state latched by latch 73. Latch cell 60 operates responsive to sense amplifier address signal SA ADDRESS, sense amplifier control signal SA CONTROL, first latch control signal LATCH CONTROL 1, and second latch control signal LATCH CONTROL 2. Sense amplifier 62 operates to drive the differential output signal DIFFERENTIAL SIGNAL OUT to match the data state of the differential input signal DIFFERENTIAL SIGNAL IN when activated. Latch 73 operates to sense, latch and drive the data state of the differential output signal DIFFERENTIAL SIGNAL OUT when activated.

Sense amplifier 62 is activated when N-FET 70 and N-FET 72 are turned on by sense amplifier address signal SA ADDRESS and sense amplifier control signal SA CONTROL. When activated, sense amplifier 62 pulls lines 67 and 68 according to the differential on lines 65 and 66.

Latch 73 is activated when N-FET 86 is turned on by the first latch control signal LATCH CONTROL 1. Latch 73 is connected to lines 67 and line 68 when P-FET 74 and P-FET 76 are activated by the second latch control signal LATCH CONTROL SIGNAL 2. When activated and connected to line 67 and line 68, latch 73 senses and stores the data state of the differential on line 67 and line 68. Latch 73 operates to retain a data state when activated and not connected to line 67 and line 68. When again connected to line 67 and line 68, latch 73 operates to drive line 67 and line 68 according to the data state retained in latch 73. Latch 73 operates to drive NODE 2 and NODE 3 to the rails, $V_{DD}$ and ground potential, according to the data state of the latch 73. However, lines 67 and 68 are not driven to the rails when latch 73 is connected due to the pull-up operation of P-FET 88 and P-FET 90.

For the configuration illustrated in FIG. 2a, there is one latch on a differential output bus associated with one or more inputs to each latch block. FIG. 2a shows only one of a plurality of possible differential inputs and associated sense amplifiers. The number of inputs determines the degree of multiplexing at this stage. With one input, this would act as a relay stage without multiplexing. The sense amplifier address signal SA ADDRESS is the signal that selects an input. The sense amplifier control signal SA CONTROL activates propagation of the selected input. The first latch control signal LATCH CONTROL 1 controls whether or not the latch is latched or unlatched. The second latch control signal LATCH CONTROL 2 controls whether or not the latch is connected to the output bus. Variations on sense amplifier and latch design can be used. For example, the SA ADDRESS and SA CONTROL signals could be combined by an AND circuit. Also, precharge or equalization circuits could be added to the sense amplifier or the latch, with additional control signals for the timing of the precharge/equalization.

For the embodiment illustrated in FIG. 2a, each latch block has one or more sense amplifiers 62 associated with the DIFFERENTIAL SIGNAL OUT and latch 73. Implemented in the embodiment illustrated in FIG. 1 in which there are two inputs to each latch block, there would be two sense amplifiers in each latch block. In one embodiment, the sense amplifier signal SA ADDRESS is different for each sense amplifier in a latch block while the sense amplifier control signal SA CONTROL is the same. In another embodiment, the same set of sense amplifier address signals and sense amplifier control signal is applied in parallel to a parallel configuration of latch blocks, such as latch blocks $30_1$ through $30_i$ in FIG. 1, and a different set of sense amplifier address signals and sense amplifier control signal are applied to other sets of latch blocks. For this embodiment, when a set of i parallel latch blocks is activated, i bits of data are latched although only a subset may be selected for output. The latched data is then available for output in subsequent access cycles without activation of the sense amplifiers in that set of parallel latch blocks.

The latch cell 60 illustrated in FIG. 2a is one embodiment. Other embodiments of latch cells are possible which would operate according to the teachings of the present invention to drive the differential output signal to match the data state of either the latched value or the differential input signal responsive to control signals. For example, there are many varieties of sense amplifiers that could be used. Also as mentioned above, it is possible to add precharge or equalization circuitry to the sense amplifiers or latches.

FIG. 2b illustrates a timing diagram showing one embodiment of the operation of the control signals for the latch cell 60 illustrated in FIG. 2a. The timing diagram of FIG. 2b illustrates an address bit $A_n$ and an address bit $A_m$. FIG. 2b also illustrates the sense amplifier address signal SA ADDRESS, the sense amplifier control signal SA CONTROL, the first latch control signal LATCH CONTROL 1, and the second latch control signal LATCH CONTROL 2. The timing diagram of FIG. 2b comprises three regions indicated 94, 96 and 98 as shown.

FIG. 2b illustrates one embodiment in which the control signals are generated from address transition detection applied to selected portions of the memory address. Sense amplifier control signal SA CONTROL can enable the sense amplifier when there is a transition in the address associated with data upstream from the sense amplifier. The sense amplifier control signal can be generated by standard address transition detection circuitry applied to a subset of the address bits, or by other circuitry such as circuitry to compare a newly input address to a stored address. For the case in which address bits are labeled such that higher address bits are associated with multiplex branches further upstream, including row addresses, this can be expressed as a transition in address bits $A_n$ where n is greater than i where i is the highest bit associated with this branch output. The signals LATCH CONTROL 1 and LATCH CONTROL 2 are also generated from such an address transition, with timing such that the newly address data is latched. A pulse in LATCH CONTROL 2 is also generated by a transition in address bits associated with selection of multiplex branches from this branch to the next latch or to the output if there is no down stream latch. If the memory device is associated with a processor, the processor could generate the control signals. In this case, a plurality of latches could be associated with the differential output bus, and data from different access cycles could be stored in different latches.

In region 94, the sense amplifier control signal SA CONTROL is low. The first and second latch control signals LATCH CONTROL 1 and LATCH CONTROL 2 are high. Thus, the sense amplifier 62 and latch 73 are not activated.

In region 96, the sense amplifier control signal SA CONTROL pulses high. Accordingly, sense amplifier 62 is activated and senses the input signal if the sense amplifier address signal SA ADDRESS is high. The first and second latch control signals LATCH CONTROL 1 and LATCH CONTROL 2 pulse high one after the other as shown. New data is latched by the latch 73. These pulses are generated by the transition in $A_n$ from region 94 to region 96.

In region 98, the second latch control signal LATCH CONTROL 2 pulses low and the sense amplifier control signal SA CONTROL is low. The data state held by latch 73 is output on the differential output signal.

There are various ways that the control signals for latch cell 60 can be generated. They can be generated and provided to the memory device by a processor accessing data from the memory. They can be generated by the memory device in response to clock signals and address sequences. The memory device can store addresses relating to the data stored in the latches and compare input addresses to the stored addresses.

In one embodiment of the present invention, the memory device generates the control signals by detecting address bit transitions in selected subsets of the address. The sense amplifier control signal SA CONTROL can be generated based on a transition in the address bits relating to the address upstream from the latch, including row address bits. The sense amplifier address signal SA ADDRESS can be generated based on a transition in address bits relating to the address at the latch and down stream from the latch. These control signals can be timed pulses to save power and to allow time for equalization and precharge. When the data accessed is available in a latch, the access can be faster as well as consume less power than when access must be made from the memory cell array.

Systems can be designed to benefit from this technical advantage of the present invention, for example, when loading a cache memory from a memory device constructed according to the teachings of the present invention. Alternatively, the timing of the sense amplifier address signal SA ADDRESS can be delayed so that the output data from the previous access will be valid longer into the current access cycle. The timing of control signals SA ADDRESS AND SA CONTROL can be made such that the activation of the sensing, latch, and output are appropriate for a full cycle whether or not a full cycle is activated.

FIG. 2c illustrates another embodiment of a latch cell indicated generally at 60 constructed according to the teachings of the present invention. The configuration of latch cell 60 of FIG. 2c is the same as that of FIG. 2a except for the addition of a P-FET 100, a P-FET 102 and a third latch control signal LATCH CONTROL 3. P-FETs 100 and 102 comprise sources coupled to the differential input lines 65 and 66 respectively, gates coupled to the third latch control signal LATCH CONTROL 3, and drains coupled to NODE 2 and NODE 3, respectively, as shown.

Latch cell 60 can be connected to similarly constructed latch cells to form latch blocks comprised of a plurality of latch cells by connecting the differential output signal DIFFERENTIAL SIGNAL OUT, lines 67 and 68, of each latch cell. Thus, the plurality of latch cells in a latch block share a differential output signal bus with each latch cell coupled to a different differential input signal. When so connected, P-FETs 88 and 90 may be common among the latch cells in the latch block. In one embodiment, the sense amplifier address signal SA ADDRESS is different for each latch cell in a latch block while the sense amplifier control signal SA CONTROL is the same.

In the embodiment illustrated in FIG. 2c, the latch 73 is associated with a single input to the multiplex branch. Multiple inputs to the branch can be latched simultaneously, even though only one is output. Again, other sense amplifier or latch circuits could be substituted, including the addition of precharge or equalization circuitry. The control signals are similar to those in FIG. 2a, except that LATCH CONTROL 2 controls connection of the latch 73 to the input rather than to the output, and an additional control signal, LATCH CONTROL 3 controls connection to the output.

Figure 2D:
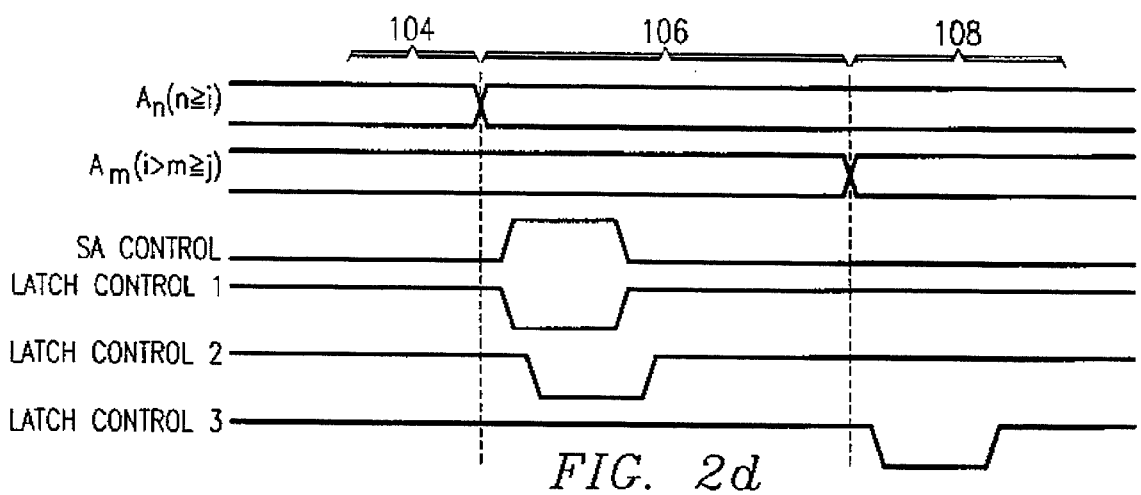
FIG. 2d illustrates a timing diagram showing one embodiment of the operation of the control signals for the latch cell illustrated in FIG. 2c.

FIG. 2d illustrates a timing diagram showing one embodiment of the operation of the control signals for the latch cell 60 illustrated in FIG. 2c. FIG. 2d illustrates the same control signals as FIG. 2b with the addition of the third latch control signal LATCH CONTROL SIGNAL 3. FIG. 2d illustrates the generation of these control signals in response to address bit transitions for one embodiment of the present invention.

The embodiment of latch cell 60 illustrated in FIG. 2a is somewhat simpler than the embodiment illustrated in FIG. 2c, but is also somewhat less effective in lowering the activation of circuit elements when data is accessed from the latch and reducing power consumption. For example, consider a multiplexer comprising two stages. Implementing the embodiment of FIG. 2a in the first of the two stages is somewhat equivalent to implementing the embodiment of FIG. 2c in the second of the two stages in that the same number of latches would be required. But when data is access from a latch, the first implementation would require the activation of more circuitry than would the second implementation. Other variations and combinations of latches and sense amplifiers are possible according to the teachings of the present invention.

Figure 3:
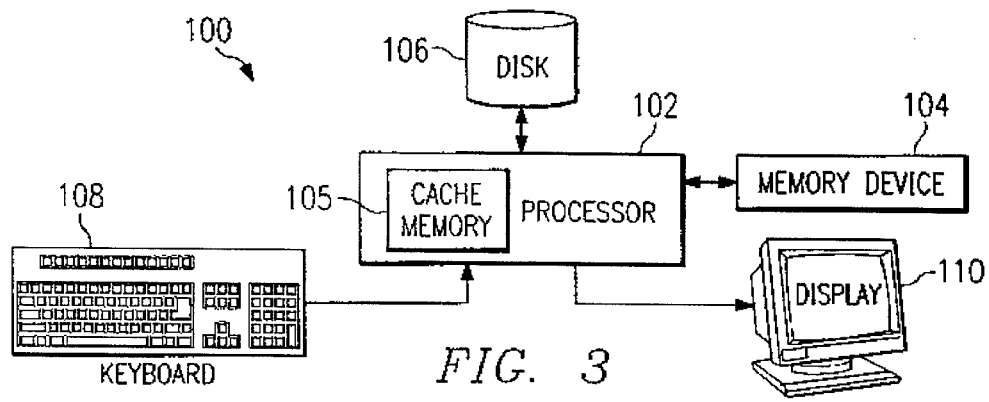
FIG. 3 illustrates a computer system utilizing a memory device constructed according to the teachings of the present invention.

FIG. 3 illustrates a block diagram of a computer system indicated generally at 100 utilizing a memory device constructed according to the teachings of the present invention. Computer system 100 comprises a processor 102 coupled to a memory device 104. Processor 102 comprises a cache memory 105. Memory device 104 is constructed according to the teachings of the present invention and includes a multiplexer block comprising an arrangement of latch blocks. A disk 106, a keyboard 108 and a display 110 are coupled to processor 102 as shown.

Processor 102 and memory device 104 operate to allow processor 102 to send a memory address to memory device 104 and to allow memory device 104 either to store data from or return data to processor 102. Processor 102 may include a cache memory 105 as shown. Disk 106 operates to provide magnetic storage for data provided by processor 102. Disk 106 also operates to provide data to processor 102. Keyboard 108 provides input to the processor 102, and display 110 displays data provided by processor 102. The computer system 100 could comprise a number of other elements conventionally used in computer systems. Any computer system utilizing memory devices can benefit from the use of a memory device constructed according to the teachings of the present invention. A large benefit will be derived by having the system map the address bits such that there are sequences of memory accesses in which only a subset of the address bits change, and such that this subset of address bits correspond to the address of the latches in the multiplexer.

Although the present invention has been described in detail, it should be understood that various changes, substitutions and alterations can be made hereto without departing from the spirit and scope of the invention as defined by the appended claims.

What is claimed is:

1. A memory device comprising;
   a memory array comprising a plurality of memory cells, the memory array operable to provide a plurality of memory array output signals responsive to a memory address, wherein each memory array output signal represents a data state of a memory cell;
   a memory device output signal representative of a preselected subset of said memory array output signals;
   a multistage multiplexer block coupling said predetermined subset of memory array output signals to the memory device output, the multiplexer block comprising at least one stage having a latch block and operable to provide a data state of a memory cell selected by said memory address to the memory device output in response to a plurality of multiplexer control signals, wherein each latch block is operable to receive at least one input signal, to retain at least one data state and provide an output signal; and
   a control block coupled to the memory array and to the multiplexer block, and operable to determine from the memory address whether the data state of the selected memory cell is retained by a latch block in the multiplexer block and to generate the plurality of multiplexer control signals to provide said data as said memory device output signal without performing a read operation of said memory array.

2. The memory device of claim 1, wherein the at least one latch block comprises a plurality of latch blocks arranged such that the plurality of data states retained correspond to sequential memory addresses.

3. The memory device of claim 1, wherein the control block is operable selectively to activate access to the memory array and to the at least one latch block responsive to the memory address.

4. The memory device of claim 1, wherein at least one of the plurality of input signals received by each latch block and of the output signal provided by each latch block comprise differential signals.

5. The memory device of claim 1, wherein each latch block comprises a plurality of latch cells equal in number to the plurality of input signals received by the latch block, and wherein each latch cell is operable to receive one of the plurality of input signals, is operable to retain a data state and is operable to provide an output signal responsive to the plurality of multiplexer control signals.

6. The memory device of claim 1, wherein the memory array comprises a plurality of memory cells arranged in a plurality of rows and a plurality of columns, and wherein the plurality of memory array outputs is equal in number to the plurality of columns and represents a plurality of data states of memory cells in one of the plurality of rows.

7. A system, comprising:
   a memory device comprising;
   a memory array comprising a plurality of memory cells, the memory array operable to provide a plurality of memory array output signals responsive to a memory address, wherein each memory array output signal represents a data state of a memory cell;
   a memory device output signal representative of a preselected subset of said memory array outputs;
   a multistage multiplexer block coupled between the memory array outputs and the memory device outputs and comprising at least one stage having a latch block and operable to provide a data state of a memory cell selected by said memory address to the memory device output in response to a plurality of multiplexer control signals, wherein each latch block is operable to receive at least one input signal, to retain at least one data state and provide an output signal; and
   a control block coupled to the memory array and to the multiplexer block, and operable to determine from the memory address whether the data state of the selected memory cell is retained by a latch block in the multiplexer block and to generate the plurality of multiplexer control signals to provide said data as said memory device output signal without performing a read operation of said memory array; and
   a processor coupled to the memory array, the processor operable to provide the memory address and operable to receive the multiplexer block output.

8. The system of claim 7, wherein the processor comprises a cache memory.

9. The system of claim 7, wherein an address corresponding to latches in the at least one latch block in the multiplexer block corresponds to at least one of a plurality of least significant bits of the memory address.

10. The system of claim 7, wherein an address corresponding to each latch in the at least one latch block corresponds to most frequently changed address bits of the memory address.

11. The system of claim 7, wherein address bits in the memory address are mapped such that address bits change only within an address space corresponding to the at least one latch block in the multiplexer block for sequential memory addresses.

12. The system of claim 7, wherein at least a subset of the memory array outputs, the plurality of input signals received by each latch block, and the output signal provided by each latch block comprise differential signals.

13. The system of claim 7, wherein each latch block comprises a plurality of latch cells equal in number to the plurality of input signals received by the latch block, and wherein each latch cell is operable to receive one of the plurality of input signals, is operable to retain a data state and is operable to provide an output signal responsive to the plurality of multiplexer control signals.

14. A method for constructing a memory device, comprising the steps of:
   providing a memory array comprising a plurality of memory cells and comprising a plurality of memory array outputs;
   providing a plurality of memory device outputs;
   providing a multistage multiplexer block having an input and an output and comprising at least one stage having a latch block, each latch block operable to receive at least one input signal, to retain at least one data state and provide an output signal;
   connecting the input of the multiplexer block to the plurality of memory array outputs and the output of the multiplexer block to the device output;
   connecting a control block to the memory array and to the multiplexer block, the control block being operable to decode a memory address to determine a selected memory cell to determine from the memory address whether a data state of the selected memory cell is stored by a latch block in the multiplexer block, and to control the multiplexer block to provide a data state of the multiplexer block output corresponding to the data state of the selected memory cell without performing a read operation of said memory array.

15. The method of claim 14, wherein the step of providing a memory array comprises providing a memory array wherein the memory array outputs comprise differential signals, and wherein the step of providing a multiplexer block comprises providing a multiplexer block wherein at least a subset of the plurality of input signals received by each latch block, and the output signal provided by each latch block comprise differential signals.

16. The method of claim 14, wherein the step of providing a multiplexer block comprises:

connecting a first stage comprising a first plurality of latch blocks to the plurality of memory array outputs, wherein the first plurality of latch blocks is operable to provide a plurality of first stage outputs and is operable to retain a plurality of data states representing a subset of the plurality of memory array outputs responsive to the multiplexer control signals; and connecting a last stage comprising a last plurality of latch blocks to the plurality of first stage outputs, wherein the last plurality of latch blocks is operable to provide the multiplexer block output responsive to the multiplexer control signals.

17. The method of claim 14, wherein the step of providing a memory array comprises providing a memory array in which the plurality of memory cells are arranged in a plurality of rows and a plurality of columns, and in which the plurality of memory array outputs is equal in number to the plurality of columns and represents a plurality of data states of memory cells in one of the plurality of rows.

18. A multistage multiplexer block comprising:

a multiplexer input for receiving a plurality of input signals;

a multiplexer output providing a subset of said input signals; and a plurality of multiplexer stages, at least one stage comprising a plurality of latch cells coupled to the plurality of input signals, the plurality of latch cells operable to retain a plurality of data states of said input signals in response to a plurality of multiplexer control signals, and operable to provide an output signal at said multiplexer output selected from one of the plurality of input signals and from the plurality of data states retained in response to the plurality of multiplexer control signals; and a control block coupled to receive an external signal indicative of data selected for the output signal and to the multiplexer block, and operable to determine from the external signal whether the data selected is retained by a latch block in the multiplexer block or must be obtained from said multiplexer input and to generate the plurality of multiplexer control signals to provide the data from the latch block or input signals as the output signal.

19. The multiplexer block of claim 18 wherein the output signal is a differential signal.

20. A memory device comprising:

a memory array comprising a plurality of memory cells arranged in rows and columns, and having a memory array output coupled to each of said columns;

a memory device output block having an input for each of a subset of said memory array outputs and an output terminal for each input;

a multistage multiplexer having an input coupled to said memory array output block and an output coupled to an input of said memory device output block and comprising at least one stage having a latch block for storing a data state of one of said memory cells; and a control block coupled to said memory array and to said multiplexer block for determining from a memory address whether the data state of a selected memory cell is stored in a latch in said multiplexer and for generating a plurality of multiplexer control signals for providing said data to an input of said output block without performing a read operation of said memory array.

21. The memory device of claim 20, wherein the at least one latch block comprises a plurality of latch blocks arranged such that the data state stored corresponds to a sequential memory address.

22. The memory device of claim 20, wherein at least one of the plurality of input signals received by each latch block and of the output signal provided by each latch block comprise differential signals.

23. A method of operating a memory device having an array of a plurality of memory cells arranged in rows and columns comprising the steps of:

a) applying a row address signal to said memory device for selecting a row in said memory cell array;

b) providing as a memory array output, signals representative of data states of at least a subset of memory cells in said row;

c) applying a column address signal to said memory device for selecting as a memory device output signal signals representative of a subset of said memory array output signals;

d) multiplexing said memory array output signals in a multistage multiplexer to provide said selected subset of memory array output signals at an output of said memory device;

e) storing data representative of a non-selected subset of said memory array output signals at least one stage of said multistage multiplexer; and f) providing output signals representative of data states of said non-selected subset of said memory cells in said row from said stored data without performing a read operation of said memory array.

24. The method of claim 23 wherein said later-selected subset corresponds to data stored in a sequential memory address.

25. The memory device of claim 23 wherein at least one of said memory array output signals comprises differential signals.

26. A memory device comprising:

a memory array comprising a plurality of memory cells arranged in rows and columns, and having a memory array output coupled to each of said columns;

a memory device output block having an input for each of a subset of said memory array outputs and an output terminal for each input;

a multistage multiplexer having an input coupled to said memory array output block and an output coupled to an input of said memory device output block and comprising at least one stage having a latch block for storing a data state of one of said memory cells; and means coupled to said memory array and to said multiplexer block for generating a plurality of multiplexer control signals and for providing said data state of a memory cell stored in a latch in said multiplexer to an input of said output block without performing a read operation of said memory array.

27. The memory device of claim 26, wherein the at least one latch block comprises a plurality of latch blocks arranged such that the data state stored corresponds to a sequential memory address.

28. The memory device of claim 26, wherein at least one of the plurality of input signals received by each latch block and of the output signal provided by each latch block comprise differential signals.

* * * * *